United States Patent [19]

Murata et al.

[11] 3,852,086

[45] Dec. 3, 1974

[54] SOLID DIFFUSION SOURCES FOR PHOSPHORUS DOPING

[75] Inventors: Yorihiro Murata, North Tonawanda; Carl H. McMurtry, Lewiston, both of N.Y.

[73] Assignee: The Carborundum Company, Niagara Falls, N.Y.

[22] Filed: June 28, 1973

[21] Appl. No.: 374,706

[52] U.S. Cl. .................................. 106/286, 106/69

[51] Int. Cl. ............................................. C08h 17/24

[58] Field of Search .............. 106/286, 69; 423/318

[56] References Cited

UNITED STATES PATENTS 2,802,750 8/1957 Veale et al. .......................... 106/69

*Primary Examiner*—Theodore Morris

*Attorney, Agent, or Firm*—David E. Dougherty; Herbert W. Mylius

[57] ABSTRACT

New solid diffusion sources for the phosphorus doping of semiconductor silicon are made from composition preferably comprising 50–90 wt% phosphorus compounds and 10–50 wt% additives by hot-pressing or cold-pressing and sintering techniques. The phosphorus compounds are reaction products of phosphorus and silicon oxides, with compositions approximating $SiO_2.P_2O_5$, and 2 $SiO_2.P_2O_5$, or $SiP_2O_7$ and $Si_2P_2O_9$, respectively. The additives are materials such as $Al_2O_3$, CaO, HfN, $HfO_2$ MgO, NbN, TaN, $ThO_2$, TiN, VN, $Y_2O_3$, ZrN, $ZrO_2$, or Zr $SiO_4$, which melt at temperatures above 2,000°C. The typical diffusion source developed is a thin slice, from one inch to four inches in diameter and from about 25–100 mils thick, made from a hot-pressed body composed of 70% of one of the phosphorus compounds and 30% $ZrO_2$, the hot-pressing conditions being, typically, 1,200°C at 1,300 psi, for 5 minutes in an argon atmosphere. This source exhibits an excellent doping ability and has a long lifetime of doping effectiveness. The doping method using such a source is simple, reliable, safe, and economical compared to conventional doping methods.

8 Claims, No Drawings

SOLID DIFFUSION SOURCES FOR PHOSPHORUS DOPING

BACKGROUND OF THE INVENTION

In the manufacture of semiconductor devices such as microwave transistors and silicon integrated circuits, shallow phosphorus diffusion in semiconductor silicon has become important. The characterization of semi conductor bodies is influenced substantially by diffusion profiles, especially from the emitter of a n-p-n structure, and the profiles are further dependent upon the diffusion source used. Up to the present time, liquid diffusion sources have been chiefly utilized in the diffusion process since satisfactory solid phosphorus diffusion sources have been unavailable. The liquid sources which have been employed are compounds such as phosphine ($PH_3$), phosphorus pentoxide ($P_2O_5$), phosphorus oxychloride ($POCl_3$) and phosphorus chlorides ($PCl_3$ and $PCl_5$). Of these liquid sources, $POCl_3$ and $PH_3$ have most frequently been used. These five phosphorus compounds are all low melting-point substances and are in liquid or gas phases at temperatures below 650°C.

Conventional doping methods for phosphorus diffusion as performed with liquid diffusion sources are, briefly, as follows. One of the compounds listed above is heated at a low temperature, below 600°C, and the phosphorus gas and/or phosphorus compound gas thus developed is introduced in a doping chamber kept at a high temperature ranging from 850°C–1200°C. In this chamber the silicon wafers to be doped are arranged parallel to the phosphorus gas flow. In this method, the carrier concentration of phosphorus, p-n junction depth, and other electronic properties of the doped wafer are primarily influenced by the reaction condition between phosphorus gas and the solid silicon wafer. This reaction is further influenced by the flow rate of gas. When a uniform diffusion layer is required, a uniform flow of gas is necessary, which is quite difficult to establish. As a result, uniform diffusion of phosphorus in terms of each silicon wafer is difficult to control. This is one of the shortcomings of conventional phosphorus doping methods using liquid diffusion sources. Another deficiency of the liquid diffusion source method is inconvenience due to the dangerous nature of the liquid sources. Phosphine, phosphorus oxychloride and many other phsophorus compounds are toxic, corrosive, flammable or explosive.

While liquid diffusion sources continue to be used for the treatment or doping of semiconductor materials, the disadvantages of irregular diffusion control and high toxicity must be overcome to give a satisfactory diffusion procedure. An effective phosphorus diffusion or doping procedure for semiconductor silicon should provide: (1) a shallow phosphorus doping in silicon; which is necessary to produce microwave transistors and modern silicon integrated circuits; (2) the doping procedure should not be complicated and should have a high reproducibility and reliability; (3) the doping procedure should be safe, even if personnel are exposed to exhaust gas during doping; and (4) the diffusion sources should be economically reusable for many doping runs.

A number of solid diffusion sources have been developed in the past. Examples of such sources are indicated by U.S. Pat. No. 3,540,951, issued Nov. 17, 1970; U.S. Pat. No. 3,473,980, issued Oct. 21, 1969; and copending U.S. Pat. application Ser. No. 239,897, filed Mar. 31, 1972, by McMurtry and Murata.

In addition, prior doping techniques have included application of a doping or donor composition directly to the surface of a semiconducting material. Examples of these techniques include U.S. Pat. No. 3,514,348, issued May 26, 1970; U.S. Pat. No. 3,630,793, issued Dec. 28, 1971; 3,354,005, issued Nov. 21, 1967; and 2,794,846, issued June 4, 1957. Such techniques have suffered from a number of faults, including non-uniformity of doping, and difficulty of control of dopant concentrations and junction depth.

The present invention provides compositions which are formed into solid diffusion sources. The sources of the invention are non-toxic and may be used in standard diffusion apparatus to give a more precise control of the diffusion treatment of semiconductor materials. These solid sources are convenient to use, and are effective over extended periods of time during service. The advantages of the invention are further described in the following detailed description.

SUMMARY OF THE INVENTION

The invention pertains to a semiconductor doping composition which comprises compounds of phosphorus and silicon and high melting additive materials. A preferred composition comprises about 70 wt% of $SiP_2O_7$ and about 30 wt% additive. The composition is formed into suitable solid diffusion sources by hot-pressing techniques or by cold forming, followed by sintering. Pressures ranging from 650–5,200 psi, and temperatures ranging from 850°C–1,450°C are employed during hot-pressing to form the solid diffusion sources of the invention. These, when cut into suitable shapes, give easily handled and economical solid sources of phosphorus for the diffusion treatment and doping of silicon semiconductor bodies.

DETAILED DESCRIPTION OF THE INVENTION

The solid phosphorus containing diffusion sources of the invention are used, preferably, in the form of thin circular discs. These discs are made from a suitable hot-pressed or sintered body, using known methods, such as diamond sawing, to cut the discs to the desired thickness and diameter. The body comprises silicon phosphate, either as $SiP_2O_7$ or $Si_2P_2O_9$, and an additive material having a melting point above 2,000°C, such as a zirconium compound, a refractory oxide, or a transition metal nitride. The diffusion sources of the invention may comprise from about 5–100 wt% of one or both of the phosphorus-silicon compositions and about 0–95 wt% of high melting additive.

The solid phosphorus dopant sources of this invention may be utilized for doping semiconductor silicon by the thermal diffusion process. For doping, the phosphorus source slices are placed between silicon wafers, with a spacing ranging from zero (intimate contact) to about 250 mils (¼ inch) in a fused silica tube. The alternating silicon and source wafers are heated at a temperature ranging from 950°C–1,350°C, for from about 10 to about 60 minutes, in flowing argon or nitrogen.

The mechanism of phosphorus doping is believed to involve the following steps.

1. During the heating process, the phosphorus source slice decomposes to yield $P_2O_5$ by evaporation.

2. The $P_2O_5$ vapor thus produced is deposited on the surfaces of the heated silicon wafers, forming a uniform coating, the thickness ranging from about 0.1μ to about 0.7μ (1,000A–7,000A).
3. Phosphorus ions diffuse from the intimate surface layer into the silicon wafer during continued heating.

The phosphorus concentration in a doped silicon wafer, therefore, is highest near the surface, and decreases toward the interior of the silicon wafer. The thickness of the phosphorus diffusion layer, which produces n-type conduction, is measurable, and is referred to herein as junction depth. Sheet resistance in ohms per square is also measured as a parameter indicative of phosphorus concentration at the surface of the silicon wafer. Measured parameters such as junction depth, sheet resistance, and $P_2O_5$ film thickness are used to indicate the phosphorus diffusion conditions for a doped silicon wafer.

The bodies of diffusion material of the invention may be fabricated in graphite molds, using hot-pressing techniques. An alternate means of fabrication for the bodies of diffusion material is by cold forming and sintering. In this method the body is cold formed in a metal mold under pressures ranging from about 5,000–25,000 psi, preferably about 10,000 psi, followed by sintering the molded body without pressure at temperatures ranging from about 1,000°C to about 1,500°C, preferably at about 1,200°C. Sintering times may range from about 2 hours up to 12 hours and may be carried out under the same atmospheres as those utilized for hot pressing. The choice of fabrication conditions is, of course, governed by the composition of the starting materials used and the conditions under which the resulting diffusion material will be used.

For example, optimum hot-pressing conditions for a composition comprising 70% $SiP_2O_7$ and 30% $ZrO_2$ are found to be 1,200°C, at 1,300 psi, for 5 minutes in an argon atmosphere. Time, temperature, and pressure are the major factors effecting properties of a hot-pressed body. These factors must be closely controlled in order to obtain the desired properties in the hot-pressed bodies.

The hot-pressing temperature, which is the most effective parameter for control of product densification, is closely related to the doping temperature at which doping slices prepared from the hot-pressed body will be utilized. The desirable maximum doping temperature is approximately 1,150°C. In order to withstand the doping temperature, the doping slice should have a thermal history of hot-pressing at a temperature slightly higher than the doping temperature. Since the melting point of silicon, the primary target for the phosphorus doping sources set forth herein, is about 1,400°C, doping temperatures should not exceed 1,300°C, in order to avoid mechanical distortion of the silicon wafer due to softening. Further, it has been found that during hot-pressing at 1,300°C, $SiP_2O_7$ is melted, resulting in extensive evaporation of phosphorus pentoxide, $P_2O_5$. This evaporation in turn brings about expansion of the body during hot-pressing, and lowers the density of the final hot-pressed body. This evaporation commences at about 1,050°C, and can also yield decreased phosphorus content in the hot-pressed body. This decreased phosphorus content should be avoided, by proper control of temperature during hot-pressing.

Thus, it may be seen that the hot-pressing temperature effects phosphorus content, bulk density, and thermal and mechanical stability of the hot-pressed body. If the doping temperature is to be relatively low, the hot-pressing temperature may be relatively low. If doping is to be done at relatively high temperatures, hot-pressing temperatures should also be relatively high. It is desirable that the difference between hot-pressing and doping temperatures should be about 50°C. Therefore, the optimum hot-pressing temperatures range from about 1,000°C to 1,350°C, dependent upon doping temperatures of from about 950°C to about 1,300°C. It is, of course, possible to hot-press at temperatures as low as about 850°C, or as high as about 1,450°C, depending upon the specific compositions being utilized.

The effect of pressure during hot-pressing may be examined in terms of bulk density of the body produced. Table I illustrates the results obtained by hot-pressing a composition comprising 70% $SiP_2O_7$ and 30% $ZrO_2$ at 1,200°C, for 5 minutes in an argon atmosphere, where the pressure applied is varied from 325 psi to 5,200 psi. Theoretical density of the body is 3.20 g/cm$^3$.

TABLE I

Effect of Pressure on the Density of the Body After Hot-pressing

| Hot-pressing Pressure Applied (psi) | Hot-pressed Body: Bulk Density (g/cm$^3$) | Hot-pressed Body: Relative Density (%) |
|---|---|---|
| 325 | 2.11 | 65.9 |
| 650 | 2.64 | 82.4 |
| 1300 | 2.86 | 89.0 |
| 2600 | 2.90 | 90.6 |
| 5200 | 3.05 | 93.8 |

It may be seen that the relative density of the hot-pressed body varies from 65.9% to 93.8%. The bodies with 89.0% and 90.6% relative density exhibit mechanical strength higher than that of sintered alumina, with a modulus of rupture of approximately 50,000 psi at room temperature. The optimum pressure is from about 1,300 psi to about 2,600 psi for the hot-pressing conditions tested. A low pressure, 325 psi, results in too low a density, while a pressure of 5,200 psi yields only a slight increase in density over 2,600 psi.

The soaking or holding time at the maximum hot-pressing temperature should be kept as short as possible in order to minimize phosphorus evaporation. The optimum time is the shortest time sufficient for complete densification, which is generally about five minutes. However, if densification is still proceeding after this time, the time factor may be varied. This is true particularly when hot-pressing refractory compositions such as alumina.

Other fabrication factors include atmosphere, heating rate, and cooling conditions. The preferred atmosphere is argon, with industrial grade (approximately 98% pure) argon being suitable. Nitrogen may alternatively be used, since both nitrogen and argon protect the graphite or graphitized carbon mold from oxidation during hot-pressing. Air or vacuum may be used if so desired, dependent upon the composition to be hot-pressed. The heating rate may be controlled to give a rate of from 20°C–30°C per minute. At a rate of 27°C per minute, it takes about 45 minutes to reach 1,200°C from room temperature, which is adequate to establish a thermal equilibrium between the graphite mold and the compact. After soaking for 5 minutes (or longer if desirable) the furnace is allowed to cool to room temperature. Pressure is maintained until the temperature drops below about 1,000°C.

Solid diffusion sources which demonstrate the best diffusion characteristics are those containing reaction products of phosphorus and silicon oxides with compositions approximating $SiP_2O_7$ and $Si_2P_2O_9$ mixed with from 5 to 95% by weight additive. Preferred compositions are in the range of about 50–90% by weight of the phosphorus-silicon compounds and about 50–10% by weight additive. Most satisfactory diffusion characteristics are obtained from compositions containing about 70 wt% additive. The phosphorus-silicon compounds are prepared by the thermal reaction of dihydrogen ammonium phosphate, $NH_4H_2PO_4$, with silicic acid, $2SiO_2.H_2O$. The phosphorus content of the resulting reaction products may be controlled by changing the relative proportions of starting materials to give reaction products with compositions approximating $SiO_2.P_2O_5$, or $2SiO_2.P_2O_5$ or mixtures thereof. The preparation of one of these products and the fabrication thereof into a phosphorus diffusion source is described in the following examples.

Example 1

Preparation of $SiP_2O_7$

A phosphorus-silicon reaction product, with a chemical formula approximating $SiO_2.P_2O_5$ ($SiP_2O_7$), is synthesized from a mixture of 2,050 grams of dihydrogen ammonium phosphate, $NH_4H_2PO_4$, and 616 grams of silicic acid, $2SiO_2.H_2O$. Both chemicals are reagent grade powder and are dry mixed for about 15 minutes using a V-blender. The total amount of this mixture is 2,666 grams and the batch composition corresponds to the composition of 50 mole% $SiO_2$ and 50 mole% $P_2O_5$.

The intimate dry mixture thus prepared is poured loosely into a fused silica vessel and the vessel then heated slowly to 700°C at a heating rate of 100°C/hour in air, using a Globar electrical heating furnace; no cover is placed on the vessel due to gas evolution during heating. At 700°C, the temperature is held constant for 12 hours. During heating, gas and smoke are developed from the chemical reaction between ammonium phosphate and silicic acid. At the end of this holding time, the smoking as almost ceased, indicating the completion of the chemical reaction for the formation of the desired product.

It is believed that the silicon phosphate, $SiP_2O_7$, can be economically synthesized, with a high yield, according to the reaction $$2NH_4H_2\,PO_4 + SiO_2.\,½\,H_2O = SiP_2O_7 + 2NH_3 + 7/2\,H_2O \quad (1)$$

The weight of the fired mixture is found to be 1,988 grams, corresponding to about 74.6% of the batch weight, while the theoretical yield calculated from Formula (1) is 74.86%. This fired $SiP_2O_7$ material is white, and is dry-crushed to a fine powder using a porcelain ball mill with natural silica stones. The powder is screened with a 100 mesh screen. An x-ray diffraction analysis of this product indicates that it is the low temperature phase, or monoclinic form, of $SiP_2O_7$, with no other phase identified.

An identical batch of raw material is prepared as above, and fired at 1,250°C in air, with aheating rate of 200°C/hour. The x-ray diffraction pattern of the product thus obtained indicates that the product is the high temperture phase, or cubic form, of $SiP_2O_7$.

Chemical analyses indicate that the phosphorus content of the monoclinic $SiP_2O_7$ is 28.65%, and the cubic 24.74%. The theoretical phosphorus content of the chemical formula is 30.7%. It is noted that the x-ray diffraction of the monoclinic and cubic forms are totally different, indicating different crystal structure. Also, the difference in phosphorus content, about 4% between the monoclinic and cubic, is considered relatively large. Both the monoclinic and cubic forms of $SiP_2O_7$ are suitable for the preparation of doping materials, although the monoclinic form is preferred due to the higher phosphorus content. Both the monoclinic and cubic forms may be formed, in varying degree, by heat treatment in the range of from about 700°C to about 1,250°C.

The forms of silicon phosphate which are stable at elevated temperatures in the $SiO_2$ - $P_2O_5$ system are $SiO_2.P_2O_5$ ($SiP_2O_7$) and $2SiO_2.P_2O_5$ ($Si_2P_2O_9$). This second composition corresponds to 2 moles of $SiO_2$ per mole of $P_2O_5$, which inherently has a lower phosphorus percentage. This compound may be made in the following fashion.

Example 2

Preparation of $Si_2P_2O_9$

The pyrophosphate with the chemical formula $Si_2P_2O_9$ ($2SiO_2P_2O_5$), is synthesized by firing an intimate mixture of 624.8 grams of dihydrogen ammonium phosphate ($NH_4H_2PO_4$) and 375.2 grams silicic acid ($2SiO_2.H_2O$) at 1,120°C for 12 hours, in air. The composition of this mixture corresponds to 66.66 mole% $SiO_2$ and 33.33 mole% $P_2O_5$, or 45.83 wt% $SiO_2$ and 54.17 wt% $P_2O_5$. The firing procedure of this synthesis is the same as that of the synthesis of $SiP_2O_7$ set forth in Example 1, with a heating rate of 100°C/hour. After firing, the material so obtained is crushed to a fine powder. An x-ray diffraction analysis of this powder identifies a single phase, $Si_2P_2O_9$. Chemical analysis shows 21.5 wt% phosphorus, which corresponds to about 91% of the theoretical value, 23.6 wt% phosphorus. Due to the higher phosphorus content of the $SiP_2O_7$ powders obtained as in Example 1, 24.74 wt% for cubic and 28.65 wt% for the monoclinic, the $SiP_2O_7$ formulation is preferred, although both formulations are suitable for use in the present invention.

The raw materials used in Examples 1 and 2 are dihydrogen ammonium phosphate, $NH_4H_2PO_4$, and silicic acid, $2SiO_2.H_2O$. The dihydrogen ammonium phosphate is a dry powder, and thus easily processed for weighing and mixing at room temperature. This compound forms an active $P_2O_5$ at about 200°C in air, according to the formula:

$$2NH_4H_2PO_4 = P_2O_5 + 2NH_3 + 3H_2O \quad (2)$$

The active $P_2O_5$ thus released at 200°C reacts with silica, thusly:

$$P_2O_5 + SiO_2 = Si\,P_2O_7 \quad (3)$$

The silica source, silicic acid, is also a dry powder at room temperature, and produces an active silica after dehydration at about 150°C. The silica thus obtained reacts withh $P_2O_5$ in accordance with Formula (3), at relatively low temperatures, e.g., 700°C. Silica sand, which is a natural material, has relatively high purity, up to 99.8% $SiO_2$. However, silica sand is quite stable up to its melting point, about 1,710°C in air, and may require higher synthesis temperatures and a longer soaking time.

Alternative sources of $P_2O_5$ and $SiO_2$ may of course be used. For example, one may utilize phosphoric acids, such as $H_3PO_4$ (ortho-), $H_4P_2O_7$ (pyro-), $HPO_3$ (meta-), and $H_4P_2O_6$ (hypo-); phosphorus oxides, i.e., $P_2O_5$ and $P_2O_3$; and ammonium phosphates, such as $(NH_4)_2H_2P_2O_6$ (hypo-), $(NH_4)_2HPO_4$ (ortho-mono), $(NH_4)H_2PO_4$ (ortho-di), $NH_4H_2PO_2$ (hypophosphite), and $NH_4H_2PO_3$ (orthophosphite). As sources of silica, one may use, in addition to the silicic acid and silica, sandpreviously mentioned, such silicon oxides as cristobalite, quartz, tridynite, lechatelierite, and amorphous or opal silicon oxide.

The nature of ion doping of semiconductor silicon requires high purity for the doping material of silicon phosphate. When the phosphate contains other compounds, such as oxides of relatively low melting point, e.g., $Fe_2O_3$, $B_2O_3$, $K_2O$, $Na_2O$, $Li_2O$, $TiO_2$, etc., these oxides may be vaporized during heating at the temperature at which doping is performed, and deposited on the surfaces of silicon wafers. The deposited oxides will form a thin film through which the ions of the oxides may be diffused into the silicon wafers. Thus, the phosphorus diffusion process will fail due to these impurity diffusions.

Therefore, the purity of raw material used is important, and should be high. In the case of the silica sand, MIMUSIL, it contains 0.08% $Al_2O_3$, 0.06% $Fe_2O_3$, 0.04% $TiO_2$, 0.02% CaO, 0.006% MgO and 0.001% $Na_2O$ plus $K_2O$. The total of these impurities is 0.207 wt%, corresponding to 2,070 ppm. In some cases of diffusion, the total impurity is required to be within the level of from 100–200 ppm.

Besides the raw material impurity, there are impurities caused by the contamination of foreign elements during fabrication processes, such as raw material mixing, firing and crushing. As for mixing, raw material dry powder is dry mixed in a V-blender for a short time (within 10 minutes). Thus, it is unlikely that any substantial contamination from this dry mixing will be introduced. Similar alternative mixing means may, of course, be utilized.

For firing, a fused silica vessel is used, and no contamination other than silica will be introdued. In this case, firing temperatures are as low as 700°C, and no chemical reaction between the silica vessel and raw materials occurs. In the case of firing at higher temperatures, 1,160° to 1,250°C, $SiP_2O_7$ crystals also develop, and a substantial reaction between silica vessel and raw material may be observed. However, a contamination of silica in $SiP_2O_7$ is not regarded as harmful for the subsequent doping process. Vessels composed of alumina, refractory oxides and stainless steel are to be avoided for the contamination problem they might represent.

Dry crushing of fired material is performed using a porcelain jar with flintstones (natural silica stones) for from about 1 to 4 hours. In this case, it is suggested that no substantial contamination is introduced due to the low hardness of the fired material and the dry crushing. The hardness of the fired material is very low, i.e., can easily be crushed by passing it between two fingers.

As a result, the preparation of silicon phosphate, $SiP_2O_7$ may be carefully done by applying (1) a dry mixing of high purity dry chemical powders using a V-blender for several minutes; (2) a synthesis of $SiP_2O_7$ compound by firing at a low temperature of 700°C using a fused silica vessel; and (3) dry crushing the soft $SiP_2O_7$ materials thus made in a porcelain jar with flintstones. The contamination from these processes is regarded as extremely low.

Solid diffusion sources may be made from silicon phosphate prepared as taught by Examples 1 and 2, incorporating additive materials in varying amount. The basic technique for the preparation of such sources is as follows.

Example 3

Preparation of Doping Materials Comprising 70% $SiP_2O_7$-30% $ZrO_2$

To a raw batch composed of 140 grams of finely divided monoclinic silicon phosphate, $SiP_2O_7$, as prepared in accordance with Example 1, and 60 grams of finely divided zirconia, $ZrO_2$, approximately 35 ml of acetone is added to provide a thick slurry. The slurry is poured into a rubber-lined ball mill having a length of about 3 inches and an inside diameter of about 4 inches, the mill previously been filled to about one-quarter of its capacity with flintstones ranging from approximately 1 inch to ½ inch in diameter. Milling is carried on for about 30 minutes, after which the mixture is dried at about 110°C for 4 hours in air. After drying, the flintstones are removed, and the dried cakes are passed through a 100 mesh silk screen. The fine powder thus made is an intimate mixture of 70% $SiP_2O_7$ and 30% $ZrO_2$, and is suitable for hot pressing.

A graphite mold, approximately 5 inches high, having an outer diameter of about 3 inches and a compression chamber about 1 inch in diameter with fitting plungers is employed for the hot-pressing. A 41.9 gram portion of the above mixture is placed in the mold, which is then placed on a vibrating table to settle and level its contents. The mold is placed into a container which is disposed within the coil of a high-frequency induction furnace, and the container is covered with a lid. A pressure of about 1,300 pounds per square inch (psi) is applied and maintained on the mold plungers. A stream of argon is introduced continuously into the container through a port therein, the atmosphere of the container being vented through a second port. The power is turned on and the temperature allowed to reach 1,200°C as measured by an optical pyrometer. This reqires about 45 minutes. This temperature is held substantially constant for 5 minutes, whereupon the power is shut off, and the pressure released when the temperature reaches about 900°C during cooling. During cooling the argon stream is continued, and the system is permitted to cool to room temperature, about 5 hours being required. The hot-pressed body is ejected from the mold and polished by means of a diamond grinding disc.

The body formed by the foregoing steps is a cylindrical slug nearing approximately one inch in diameter and 1.054 inches high. The bulk density is 2.883 g/cc corresponding to 90.18% of the theoretical density, 3.197 g/cc. This hot-pressed body exhibits no water absorption in a water immersion test, and high mechanical strength.

Example 4

Preparation of Doping Materials Comprising Various Portions of $SiP_2O_7$-$ZrO_2$ In substantial accordance with the procedure set forth in Example 3, slugs of different compositions are prepared by hot-pressing mixtures consisting of desired proportions of $SiP_2O_7$ and $ZrO_2$. The proportions are indicated as weight percents in the following table, and the amount of mixture used to make a slug approximately one inch high and approximately one inch in diameter is also set forth.

TABLE II $SiP_2O_7$ — $ZrO_2$ Mixtures

| Percent $SiP_2O_7$ | Percent $ZrO_2$ | Grams of Mixture per slug |
|---|---|---|
| 20 | 80 | 59.3 |
| 30 | 70 | 54.5 |
| 40 | 60 | 50.4 |
| 50 | 50 | 46.9 |
| 50 | 40 | 43.8 |
| 70 | 30 | 41.1 |
| 80 | 20 | 38.8 |
| 90 | 10 | 36.7 |
| 95 | 5 | 35.7 |
| 100 | 0 | 34.8 |

From slugs prepared as in Example 4, solid diffusion sources are fabricated by utilizing conventional means to slice and grind the slugs into thin disks of approximately 0.025 inches thickness and approximately 1 inch diameter. These dimensions are established within sufficiently close tolerances to permit accurate comparisons of the diffusion sources in phosphorus doping tests of semiconductor silicon wafers.

Example 5

Doping Test Results of Phosphorus Diffusion Sources, $SiP_2O_7$ - $ZrO_2$.

The results of phosphorus doping using the solid diffusion sources prepared according to Example 4 are listed in Table III. In each case, constant doping conditions are applied. The sheet resistance and junction depth are measured with the silicon wafer doped utilizing the phosphorus diffusion source as a point of evaluation for the so-called doping ability. The doping conditions are as follows: a silicon wafer of one inch diameter and 8–12 microns thickness is placed on a solid diffusion source, one inch diameter and 25 mils (635 microns) thick, and their intimate contact established. Then, this stacking arrangement is inserted in a furnace kept at 1,100°C, and soaked for 30 minutes in a nitrogen flow. After soaking, it is removed from the furnace to cool to room temperature. After cooling, besides sheet resistance and junction depth, the thickness of the oxide layer developed on the silicon wafer is measured. In this doping test, the conventional doping method utilizing $PBr_3$ (phosphorus bromide) gas is examined at the same doping temperature and soaking time, as a comparative example. The results of this example were 2.5 ohms/square of sheet resistance and 2.5 microns of junction depth. It is to be noted that lower sheet resistance indicates higher concentration of phosphorus and higher junction depth indicates deeper doping.

TABLE III

Results of Doping Tests Using $SiP_2O_7$ — $ZrO_2$ Sources

| Composition (Wt.%) $SiP_2O_7$ | $ZrO_2$ | Sheet Resistance (ohms/square) | Junction Depth (microns) | Thickness of Oxide Layer (Angstroms) |
|---|---|---|---|---|
| 20 | 80 | 6.47* | 2.43* | 1,000* |
| 30 | 70 | 4.51* | 2.55* | 1,000* |
| 40 | 60 | 5.24 | 2.65 | 1,000 |
| 50 | 50 | 2.21 | 3.09 | 3,500 |
| 60 | 40 | 2.00 | 3.09 | 1,700 |
| 70 | 30 | 1.81 | 3.09 | 1,700 |
| 80 | 20 | 2.02 | 2.80 | 5,000 |
| 90 | 10 | 1.90 | 2.80 | 5,000 |
| 95 | 5 | 2.00 | 2.95 | 5,000 |
| 100 | 0 | 2.17 | 2.70 | 5,000 |
| $PBr_3$ | | 2.5 | 2.5 | |

*Obtained from doping test conducted at 1150°C. for 30 minutes, in $N_2$.

Example 6

Preparation of Doping Materials Comprising $SiP_2O_7$ and Various Additives

Slugs with different compositions are prepared by hot-pressing mixtures consisting of desired proportions of $SiP_2O_7$ and additives, the additives utilized being CaO, MgO, $Al_2O_3$, $ThO_2$, $Y_2O_3$, TiN, ZrN, HfN, $HfO_2$, VN, NbN, TaN, and $ZrSiO_4$. The proportions are indicated as weight percents in Table IV, and the amount of mixture used to make a slug approximately 1 inch high and approximately 1.5 inches in diameter is also set forth. The theoretical densities and melting points of these additive compounds are listed in Table V.

TABLE IV

Theoretical Density and Powder Amount of $SiP_2O_7$ — Additive Systems

| Composition, Wt% $SiP_2O_7$ | Additive | | Theoretical Density ($g/cm^3$) | Powder Amount, (gr) 1" D. × 1" H. Slug | 1.5" D. × 1"H. Slug |
|---|---|---|---|---|---|
| 20 | 80 | $HfO_2$ | 6.381 | 82.1 | 184.8 |
| 70 | 30 | $HfO_2$ | 3.445 | 44.3 | 99.8 |
| 95 | 5 | $HfO_2$ | 2.801 | 36.1 | 81.1 |
| 20 | 80 | $ZrSiO_4$ | 4.008 | 51.6 | 116.1 |
| 70 | 30 | $ZrSiO_4$ | 3.076 | 39.6 | 89.1 |
| 95 | 5 | $ZrSiO_4$ | 2.756 | 35.5 | 79.8 |
| 20 | 80 | CaO | 3.193 | 41.1 | 92.5 |
| 70 | 30 | CaO | 2.866 | 36.9 | 83.1 |
| 95 | 5 | CaO | 2.726 | 35.1 | 78.9 |
| 20 | 80 | MgO | 3.361 | 43.3 | 97.3 |
| 70 | 30 | MgO | 2.911 | 37.5 | 84.3 |
| 95 | 5 | MgO | 2.734 | 35.2 | 79.2 |
| 20 | 80 | $Al_2O_3$ | 3.424 | 44.1 | 99.2 |
| 70 | 30 | $Al_2O_3$ | 2.987 | 38.4 | 86.5 |
| 95 | 5 | $Al_2O_3$ | 2.744 | 35.3 | 79.5 |
| 20 | 80 | $ThO_2$ | 6.500 | 83.6 | 188.3 |
| 70 | 30 | $ThO_2$ | 3.458 | 44.5 | 100.2 |
| 95 | 5 | $ThO_2$ | 2.802 | 36.1 | 81.2 |
| 20 | 80 | $Y_2O_3$ | 4.289 | 55.3 | 124.2 |
| 70 | 30 | $Y_2O_3$ | 3.135 | 40.4 | 90.8 |
| 95 | 5 | $Y_2O_3$ | 2.764 | 35.6 | 80.1 |
| 20 | 80 | TiN | 4.516 | 58.2 | 130.8 |
| 70 | 30 | TiN | 3.179 | 40.9 | 92.1 |
| 95 | 5 | TiN | 2.769 | 35.7 | 80.2 |
| 20 | 80 | ZrN | 5.350 | 68.9 | 154.9 |
| 70 | 30 | ZrN | 3.316 | 42.7 | 96.0 |

TABLE IV-Continued

Theoretical Density and Powder Amount of $SiP_2O_7$ — Additive Systems

| Composition, Wt% $SiP_2O_7$ | Additive | Theoretical Density (g/cm³) | Powder Amount, (gr) 1" D. × 1" H. Slug | 1.5" D. × 1"H. Slug |
|---|---|---|---|---|
| 95 | 5 ZrN | 2.786 | 35.9 | 80.7 |
| 20 | 80 HfN | 7.583 | 97.6 | 219.6 |
| 70 | 30 HfN | 3.559 | 45.8 | 103.1 |
| 95 | 5 HfN | 2.813 | 36.2 | 81.5 |
| 20 | 80 VN | 4.488 | 62.9 | 141.6 |
| 70 | 30 VN | 3.245 | 41.8 | 93.9 |
| 95 | 5 VN | 2.777 | 35.8 | 80.4 |
| 20 | 80 NbN | 5.906 | 76.1 | 171.1 |
| 70 | 30 NbN | 3.390 | 43.7 | 98.2 |
| 95 | 5 NbN | 2.795 | 35.9 | 80.9 |
| 20 | 80 TaN | 8.119 | 104.6 | 235.2 |
| 70 | 30 TaN | 3.602 | 46.4 | 104.3 |
| 95 | 5 TaN | 2.817 | 36.3 | 81.6 |
| 20 | 80 $ZrO_2$ | 4.610 | 59.4 | 133.5 |
| 70 | 30 $ZrO_2$ | 3.197 | 41.2 | 92.6 |
| 95 | 5 $ZrO_2$ | 2.772 | 35.7 | 80.3 |

TABLE V

Theoretical Density and Melting Points of Raw Material Compounds for Making Phosphorus Doping Materials

| Compound | Theoretical Density (g/cm³) | Melting Point (C) |
|---|---|---|
| $Al_2O_3$ | 3.97 | 2015 |
| CaO | 3.346 | 2580 |
| HfN | 13.84 | 3300 |
| $HfO_2$ | 9.68 | 2810 |
| MgO | 3.58 | 2800 |
| NbN | 8.40 | 2573 |
| TaN | 16.30 | 3440 |
| $ThO_2$ | 10.03 | 3050 |
| TiN | 5.43 | 2950 |
| VN | 6.13 | 2050 |
| $Y_2O_3$ | 5.03 | 2410 |
| ZrN | 7.09 | 2980 |
| $ZrO_2$ | 5.60 | 2715 |
| $ZrSiO_4$ | 4.56 | 2550 |
| $SiP_2O_7$ | 2.70 | 1290 |
| $Si_2P_2O_9$ | 2.50 | |

Example 7

Preparation of Doping Materials Comprising $Si_2P_2O_9$ and Various Additives The $Si_2P_2O_9$ powder prepared in accordance with Example 2 is hot-pressed with an additive selected from compounds such as $ZrO_2$, $Y_2O_3$, CaO, MgO, $ZrSiO_4$, $Al_2O_3$, $HfO_2$, $ThO_2$, and TaN. The batch compositions of these hot-pressed bodies and their powder amounts are listed in Table VI. From each hot pressing, a slug approximately 1.5 inches in diameter and 1.0 inch high is made. Then, doping material wafers, approximately 1.5 inches in diameter and 25 mils thick, made by diamond-machining the slug, are then examined for the phosphorus doping of silicon wafers.

TABLE VI

Chemical Composition and Powder Amount of Phosphorus Doping Materials Composed of $Si_2P_2O_9$ Material

| Composition, wt% $Si_2P_2O_9$ | Additive | Theoretical Density g/cm³ | Powder Amount, gr. 1.5" D. × 1" H. Slug |
|---|---|---|---|
| 100 | — | 2.50 | 72.4 |
| 95 | 5 $ZrO_2$ | 2.77 | 80.2 |
| 70 | 30 $ZrO_2$ | 3.196 | 92.6 |

TABLE VI – Continued

Chemical Composition and Powder Amount of Phosphorus Doping Materials Composed of $Si_2P_2O_9$ Material

| Composition, wt% $Si_2P_2O_9$ | Additive | Theoretical Density g/cm³ | Powder Amount, gr. 1.5" D. × 1" H. Slug |
|---|---|---|---|
| 20 | 80 $ZrO_2$ | 4.61 | 133.5 |
| 70 | 30 $Y_2O_3$ | 3.14 | 90.9 |
| 70 | 30 CaO | 2.87 | 83.1 |
| 70 | 30 MgO | 2.91 | 84.6 |
| 70 | 30 $ZrSiO_4$ | 3.08 | 89.2 |
| 70 | 30 $Al_2O_3$ | 2.93 | 84.9 |
| 70 | 30 $HfO_2$ | 3.45 | 99.9 |
| 70 | 30 $ThO_2$ | 3.46 | 100.2 |
| 70 | 30 TaN | 3.60 | 104.3 |

As previously indicated, the mechanism of phosphorus doping is dependent upon decomposition and evaporation of $P_2O_5$. When no evaporation of $P_2O_5$ occurs, phosphorus diffusion does not take place. Further, it should be noted that when the amount of evaporation of $P_2O_5$ is too small, the substantial diffusion of phosphorus is also not established. In other words, the diffusion is dependent on the extent of vapor pressure of $P_2O_5$ coming up from the doping material during heating. Furthermore, the extent of this vapor pressure is essentially dependent on the phosphorus concentration in the doping material, i.e., the chemical composition, as will be shown in the following Example.

Example 8

Rate of Evaporation of Phosphorus from Doping Materials During Heating

Doping tests are conducted upon a number of samples of the $SiP_2O_7$-$ZrO_2$ doping materials prepared in accordance with Example 4. These samples are heated in air for 3 hours at 1,150°C to determine weight loss, as a percentage of original sample weight. Doping runs are then conducted in accordance with the technique set forth in Example 5.

It may be seen that the chemical composition of the doping material has a great effect on doping ability. Higher concentrations of phosphorus of doping material result in higher doping ability. Table VII shows the weight loss of various doping slices, 1.0 inch diameter and 25 mils thick, after heating at a temperature of 1,150°C for 3 hours in air. The weight loss is attributed to $P_2O_5$ evaporation during heating. In Table VII are also given the sheet resistance, junction depth and thickness of $P_2O_5$ film of doped silicon wafers.

From these results it may be concluded that a doping slice made from 70% $SiP_2O_7$ and 30% $ZrO_2$ has excellent doping ability, a low sheet resistance of approximately 1.8 ohms per square, and a relatively large junction depth of about 3 microns. Also, this slice has a large weight loss of about 2.3% at 1,150°C for 3 hours in air.

For comparison, weight loss measurement is also made with the raw material, silicon phosphate, $SiP_2O_7$, using TGA (thermogravimetric analysis) apparatus up to 1,250°C in an argon atmosphere. The raw materials measured here are the powders of $SiP_2O_7$, synthesized at a low temperature of 700°C and at a high temperature of 1,250°C. These powders are expressed respectively by $SiP_2O_7$ (700°C) and $SiP_2O_7$ (1,250°C). The heating rate is 20°C/min. and soaking time at 1,200°C is 5 minutes. These conditions are almost similar to the hot-pressing conditions. The total weight loss is found to be 23.28 wt% for $SiP_2O_7$ (700°C) and 11.4 wt% for $SiP_2O_7$ (1,250°C), the difference between these weight losses being 11.87 wt%, which is regarded as quite large. The difference is essential and depends upon the phosphorus content contained in the original $SiP_2O_7$ compounds, that is, 28.65% P for $SiP_2O_7$ (700°C) and 24.74% P for $SiP_2O_7$ (1,250°C), as previously indicated. It is noted that a substantial weight loss is initiated from about 950°C for both $SiP_2O_7$ compounds, indicating that both compounds may be used for phosphorus doping at temperatures above 950°C. From total weight loss, the material $SiP_2O_7$ (700°C), is much more effective for the evolution of phosphorus gas at temperatures above 1,100°C than $SiP_2O_7$ (1,250°C).

Example 9

Weight Loss and Warpage of Doping Materials During Heating

In the previous Example, it is mentioned that the weight loss of a doping material during heating at elevated temperature is attributed to the evaporation of phosphorus containing materials, which causes the diffusion of phosphorus ions in silicon wafers. Therefore, it is concluded that weight loss measurement is quite useful for the evaluation of the doping ability.

In the present Example, weight loss and warpage of a doping slice are determined when the concentration of $SiP_2O_7$ is as high as 70% to 100%. Weight loss is measured after heating at 1,150°C in air for 3 hours. As for the warpage, distortion of a doping slice during heating is observed and the maximum deflection measured using a micrometer. When the warpage is large, the slice would not be useful for further doping runs. This means that the life of the doping material is defined by the amount of warpage, even if the chemical ability for doping is still high.

In Table VIII, the weight loss and warpage measured for the above high phosphorus concentration materials are shown. In the composition of 70% $SiP_2O_7$ and 30% $ZrO_2$, three different bulk density bodies were made by varying the pressure applied during hot-pressing.

With respect to Table VIII, sample Nos. 1, 2 and 3 have respectively 89.0%, 69.5% and 85.2% of relative density. As shown, a high density body (No. 1) has a low weight loss. This indicates that weight loss depends upon the density, as would be anticipated. Also, it is observed that Sample No. 1 exhibits blistering with a large warpage of 50 mils. A lower density slice, Sample No. 3, shows no blistering and small warpage, 5 mils. It is concluded from the above results that a high density body has a tendency to blister, probably due to trapping of the decomposed phosphorus gas in the body.

In the case of high concentration of $SiP_2O_7$, that is, Sample Nos. 4, 5, 6 and 7, weight loss is as high as 16%, except for Sample No. 7 which is 100% $SiP_2O_7$. This 100% $SiP_2O_7$ body has a density of about 86% and a low warpage of 4 mils. This indicates that this material is also a suitable doping material.

In conclusion, a high weight loss is usually obtained with doping materials fabricated from a high $SiP_2O_7$ concentration ranging from 70% to 100%. From a view of warpage, a relatively low density body (83–86% of relative density) is to be preferred.

Example 10

Properties of Hot-Pressed Bodies of $SiP_2O_7$ - Additive Compositions

A hot-pressed body composed of 70% $SiP_2O_7$ and 30% $ZrO_2$ exhibits a high density, ranging from 80% to 90% of relative value, and this composition does not experience technical problems such as extensive mold reaction, crack in body, back-up expansion and mate-

TABLE VII

Chemical Compositions and Doping Test Results of Solid Diffusion Sources Composed of $SiP_2O_7$ and $ZrO_2$

| Composition $SiP_2O_7$ | (wt%) $ZrO_2$ | Bulk Density (g/cc) | Weight Loss (wt%) | Sheet Resistance (Ohms/Square | Junction Depth (microns) | Oxide Layer (Angstroms) |
|---|---|---|---|---|---|---|
| 30 (I) | 70 | 2.957 | 0.070 | — (1) | — (1) | — (1) |
| 40 (I) | 60 | 2.797 | 1.280 | 5.24 (2) | 2.65 (2) | 1,000 (2) |
| 40 (II) | 60 | 3.365 | (+)0.029 | — (1) | — (1) | — (1) |
| 50 (I) | 50 | 2.879 | 0.852 | 2.21 (3) | 3.09 (3) | 3,500 (3) |
| 70 (I) | 30 | 2.883 | 2.268 | 1.81 (3) | 3.09 (3) | 1,700 (3) |

(1) No substantial doping effect was observed.
(2) Values after three doping runs at 1100°C for 30 minutes in $N_2$.
(3) Values after four doping runs at 1100°C for 30 minutes in $N_2$. The Conventional doping method using $PBr_3$ gas resulted in 2.5 ohms/square of sheet resistance and 2.5 microns of junction depth.
(I) Monoclinic form.
(II) Cubic form.

TABLE VIII

Weight Loss and Warpage of Doping Materials Composed of $SiP_2O_7$ and $ZrO_2$

| (wt%) Sample No. | Composition $SiP_2O_7$ | $ZrO_2$ | Weight Loss (wt%) 1 hr | 2 hrs. | 3 hrs. | Warpage (mils) | Bulk Density (g/cc) | Relative Density (%) |
|---|---|---|---|---|---|---|---|---|
| 1 | 70 | 30 | 0.43 | 0.43 | 0.83 | 50 | 2.845 | 89.0 |
| 2 | 70 | 30 | 9.01 | 13.14 | 15.16 | 20 | 2.223[2] | 69.5 |
| 3 | 70 | 30 | 3.35 | 6.39 | 9.12 | 5 | 2.723 | 85.2 |
| 4 | 80 | 20 | 8.40 | 12.67 | 15.88 | 100 | 2.501 | 83.0 |
| 5 | 90 | 10 | 8.77 | 13.06 | 16.42 | 20 | 2.399 | 84.2 |
| 6 | 95 | 5 | 9.71 | 13.19 | 16.00 | 2 | 2.138 | 77.1 |
| 7 | 100 | 0 | 6.09 | 8.05 | 9.98 | 4 | 2.325 | 86.1 |

rial squeezing during hot pressing. Also, doping materials (slices fabricated from this hot-pressed body show excellent ability for phosphorus doping of a silicon wafer. Other compounds, besides $ZrO_2$, are also considered to be good as an additive for $SiP_2O_7$. Therefore, additional compounds are examined from the view of hot-pressing conditions and resulting properties. Table IX shows the results of this study. The following additive compounds are examined:

Zirconia (99% $ZrO_2$),
Stabilized Zirconia,
Zircon Sand ($Si_2ZrO_4$, 100 mesh),
Zircon powder (below one micron),
$Al_2O_3$, MgO, CaO, $HfO_2$, $ThO_2$, $Y_2O_3$,
TaN, TiN and NbN The expected properties of these additives are (1) no chemical reaction with $SiP_2O_7$ during hot pressing at 1,200°C, (2) resulting in relative high density without segregation and crack, (3) resulting in a high mechanical strength. The lack of chemical reaction between $SiP_2O_7$ and an additive should result in a mechanical mixture of the original raw material particles, $SiP_2O_7$ and the additive, after hot-pressing. An example of this no chemical reaction case is a hot-pressed body composed of boron nitride (BN) and silica ($SiO_2$).

Also desirable is a highly dense body, which is brought mainly by the plastic deformation of $SiP_2O_7$ at elevated temperature during hot-pressing. It should be noted that the additives listed above are all refractory compounds which have higher melting points than that of $SiP_2O_7$, about 1,290°C, and specifically, higher than about 2,000°C. The mechanical strength of a body is associated with the grain boundary conditions between the particles of $SiP_2O_7$ and additive.

These expected properties (no reaction, high density, and strength) are, however, the ideal case. In the case of the phosphorus compound, it has been found that a small degree of chemical reaction between the $SiP_2O_7$ and additive may take place. The net problem, therefore, is the degree and type of reaction. Extensive reaction will result in melting, cracking, segregation, low density, squeezing material, etc. Therefore, the following four points are examined: (1) mold reaction, (2) cracks, (3) back-up expansion, and (4) material squeezing.

Mold reaction occurs at the interface of graphite mold and compact. When this reaction is extensive, the compact would not be removable from the mold. The reaction therefore, is the reaction between carbon and compact material.

Cracks are suggested to be caused primarily by the thermal expansion difference between mold and compact, but in some cases, cracks appear to be caused by material segregation in the compact itself. Cracks are the worst potential damage of the hot-pressed body.

Back-up expansion occurs at elevated temperatures during hot-pressing. The expansion is believed to be due to the evolution of phosphorus gas, caused by the decomposition of $SiP_2O_7$ during hot-pressing. The temperature at which the back-up expansion is initiated is, therefore, the decomposition temperature of $SiP_2O_7$ in the presence of a respective additive. The temperature depends upon the kind of additive, where some additives promote the decomposition. When the back-up expansion is large, the hot-pressing should be terminated immediately, to avoid a possible explosion in the hot-pressing furnace.

In addition, there is the squeezing of material out of the mold, caused by melting of the compact during hot-pressing. The melting is due to the reaction between $SiP_2O_7$ and additive, resulting in a eutectic.

It may be seen from Table IX that the additives which do not cause mold reaction, cracks, back-up expansion and squeezing material are $ZrO_2$, MgO and zircon. Other additives exhibit some of these problems.

The results summarized in Table IX are obtained from hot-pressing at 1200°C, regardless of the specific additive. It is accordingly suggested that some additive compositions should be hot-pressed at lower temperatures, in order to get a high density without accompanying back-up expansion. At this lower temperature, mold reaction and cracks may be expected to be reduced or eliminated.

Since squeezing of material is caused by melting the mixture of $SiP_2O_7$ and an additive, use of a lower temperature during hot-pressing may eliminate squeezing as well. Such a suitable lower temperature is estimated from the temperature at which the total drop of the plungers reaches the maximum, as listed in Table IX.

TABLE IX

Properties of Hot-Pressed Bodies Composed of $SiP_2O_7$ — Additive Compositions
(Hot-Pressing Conditions: 1200°C, 2000 psi, 5 min, Ar)

| Additive (wt.%) | Theoretical Density (g/cc) | Density Bulk (g/cc) | Density Relative (%) | Drop at 1200°C (in) | Max. Drop (in) | Spec. Temp. (°C) | Mold Reaction | Cracks | Back-up Expansion | Squeezing Material |
|---|---|---|---|---|---|---|---|---|---|---|
| 30 $ZrO_2$ | 3.119 | 2.606 | 83.7 | NA (1) | NA | NA | No | No | No | No |
| | | 2.699 | 84.4 | | | | | | | |
| 30 $ZrO_2$ | 3.119 | 2.174 | 68.0 | 0.123 | 0.350 | 1125 | No | No | Slight | No |
| 30 $ZrO_2$ | 3.119 | 2.697 | 84.4 | 0.627 | NA | NA | No | No | 0.123" | No |
| | | 2.563 | 80.2 | | | | | | | |
| 30 $ZrO_2$ | 3.119 | 2.730 | 85.45 | 0.203 | 0.290 | 1170 | No | No | 0.077" | No |
| 30 $Al_2O_3$ | 2.980 | 2.206 | 73.0 | 0.385 | 0.388 | 1165 | No | Slight | 0.003" | No |
| 30 CaO | 2.866 | 2.230 | 78.0 | 0.629 | 0.632 | 1145 | No | Slight | 0.003" | No |
| 30 TaN | 3.602 | NA | NA | 0.62 (2) | NA | NA | Yes | Yes | Great | Yes |
| 30 MgO | 2.911 | 2.66 | 91.46 | 0.675 | 0.675 | 1200 | No | No | No | No |
| 30 $HfO_2$ | 3.445 | 2.97 | 86.0 | 0.382 | 0.410 | 1195 | Slight | No | No | No |
| 30 $ThO_2$ | 3.458 | 2.54 | 73.0 | 0.290 | 0.290 | 1195 | Slight | No | No | Yes |
| 30 Zircon-Sand | 3.076 | 2.505 | 81.0 | 0.320 | 0.397 | 1175 | No | No | 0.073" | No |
| 30 Zircon-Powder | 3.076 | 2.781 | 90.0 | 0.370 | 0.370 | 1195 | No | No | No | No |
| 80 $Y_2O_3$ | 4.289 | 2.815 | 65.6 | 0.206 | 0.206 | 1200 | No | Yes | No | No |
| 30 $Y_2O_3$ | 3.135 | 2.361 | 75.0 | 0.331 | 0.399 | 1055 | Slight | No | 0.072" | Yes |
| 5 $Y_2O_3$ | 2.764 | 2.17 | 77.0 | 0.407 | 0.376 | 1120 | Yes | Yes | Great | No |
| 30 TiN | 3.179 | 1.84 | 57.8 | 0.089 (2) | 0.151 | 1145 | Slight | No | 0.228" | No |
| 30 NbN | 3.390 | 1.59 | 46.5 | 0.52 (2) | 0.045 | 1060 | Slight | Yes | 0.725" | No |

(1) NA: Not available
(2) Expansion

TABLE X

Optimum Hot-Pressing Temperature Estimated for Each Additive

| Additive (wt.%) | Theoretical Density (g/cc) | Bulk Density (g/cc) | Relative Density (%) | Optimum Hot Pressing Temperature (°C) | Optimum Doping Temperature (°C) |
|---|---|---|---|---|---|
| 30 $ZrO_2$ | 3.119 | 2.730 | 85.5 | 1200 | 1150 |
| 30 Zircon-Sand | 3.076 | 2.505 | 81.0 | 1200 | 1150 |
| 30 Zircon-Powder | 3.076 | 2.781 | 90.0 | 1200 | 1150 |
| 30 Stabilized, $ZrO_2$ | 3.197 | 2.81 | 88.0 | 1200 | 1150 |
| 30 $Al_2O_3$ | 2.980 | 2.206 | 73.0 | 1200 | 1150 |
| 30 MgO | 2.911 | 2.660 | 91.5 | 1200 | 1150 |
| 30 CaO | 2.866 | 2.230 | 78.0 | 1200 | 1150 |
| 30 $HfO_2$ | 3.455 | 2.970 | 86.0 | 1200 | 1150 |
| 30 $ThO_2$ | 3.458 | 2.54 | 73.0 | 1200 | 1150 |
| 80 $Y_2O_3$ | 4.289 | 2.815 | 65.6 | 1200 | 1150 |
| 30 $Y_2O_3$ | 3.135 | 2.82 | 90.0 | 1055 | 1000 |
| 5 $Y_2O_3$ | 2.764 | 2.30 | 83.4 | 1120 | 1070 |
| 30 TaN | 3.602 | 2.24 | 62.0 | 1020 | 970 |
| 30 TiN | 3.179 | 2.92 | 91.9 | 1145 | 1100 |
| 30 NbN | 3.390 | 2.14 | 63.0 | 1060 | 1000 |

TABLE XI

Doping Test Results of Phosphorus Diffusion Sources Composed of $SiP_2O_7$ and Additive

| Additive | Wt.% | Relative Density (%) | Sheet Resistance (ohms/square) | Junction Depth (Microns) |
|---|---|---|---|---|
| $ZrO_2$ | 95 | | 8.32 | 1.37 |
| | 90 | | 8.53 | 1.85 |
| | 80 | | 6.47 | 2.43 |
| | 70 | | 4.51 | 2.55 |
| | 60 | | 5.24 | 2.65 |
| | 50 | | 2.21 | 3.09 |
| | 40 | | 2.00 | 3.09 |
| | 30 | 89.0 | 1.81 | 3.09 |
| | 30 | 69.5 | 1.70 | 2.95 |
| | 30 | 85.2 | 2.43 | 2.75 |
| | 20 | | 2.02 | 2.80 |
| | 10 | | 1.90 | 2.80 |
| | 5 | | 2.00 | 2.95 |
| $Al_2O_3$ | 30 | 73.0 | 4.60 | 2.05 |
| $HfO_2$ | 30 | 86.0 | 2.69 | 2.65 |
| CaO | 30 | 78.0 | 27.6 | 1.47 |
| MgO | 30 | 91.5 | | |
| $ZrSiO_4$ (sand) | 30 | 81.0 | 2.46 | 2.75 |
| $ZrSiO_4$ (Powder) | 30 | 90.0 | 2.42 | 2.75 |
| $ThO_2$* | 30 | 73.0 | 35.0 | 0.29 |
| $Y_2O_3$* | 30 | 90.0 | 131.3 | 0.10 |
| $ZrO_2$* | 30 | 88.0 | 24.7 | 0.15 |
| $ZrO_2/Al_2O_3$* | 20/10 | 79.0 | 56.3 | 0.22 |
| $ZrO_2/SiO_2$* | 20/10 | 76.0 | 19.9 | 0.25 |
| $ZrO_2/Y_2O_3$* | 20/10 | 80.3 | 27.4 | 0.35 |
| $ZrO_2/Y_2O_3$* | 25/5 | 75.6 | 34.8 | 0.35 |

*Doping Temperature 900° C.

Table X shows results estimated from this low temperature hot-pressing. It is noted that the optimum doping temperature should be lowered in this case, as indicated.

Example 11

Doping Tests of Various $SiP_2O_7$ - Additive Systems

Additional phosphorus doping tests are conducted using solid diffusion sources prepared as in previous examples. In addition, tests are conducted upon $SiP_2O_7$-mixed additive systems, wherein two or more additives are employed. The results of these tests are set forth in Table XI. Doping conditions, unless otherwise indicated are as follows. A slice of the dopant source, 25 mils thick, is placed vertically between two silicon wafers, 1 inch in diameter and 10 mils thick, at a spacing of 0.125 inches. This arrangement is heated at 1,100° C in a nitrogen flow in a fused silica tube. After cooling, characteristics of the silicon wafers thus doped are examined. It is found that such $SiP_2O_7$-additive systems are capable of being used a plurality of times as sources.

Variations and modifications of the above are of course possible, dependent upon specific requirements and the properties of the additive utilized, and are to be considered within the scope of the invention. It is possible to thus establish optimum phosphorus concentration of the doping material, thereby controlling the rate of phosphorus evaporation during doping, and enhancing thermal stability, by choice and concentration of additive.

While the invention has been described herein with reference to certain preferred embodiments, it is to be understood that various changes and modifications may be made by those skilled in the art without departing from the concept of the invention, the scope of which is to be determined by reference to the following claims.

What is claimed is:

1. A solid phosphorus containing source body for semiconductor diffusion doping, said body comprising from about 5 to about 95% by weight of compounds of silicon and phosphorus selected from the group consisting of $SiP_2O_7$, $Si_2P_2O_9$, and mixtures thereof, and from about 95 to about 5% by weight of an additive material having a melting point greater than 2000°C, selected from the group consisting of $Al_2O_3$, CaO, HfN, $HfO_2$, MgO, NbN, TaN, $ThO_2$, TiN, VN, $Y_2O_3$, ZrN, $ZrO_2$, and $ZrSiO_4$.

2. A solid phosphorus containing source body as set forth in claim 1, wherein said additive is selected from the group consisting of $ZrO_2$, MgO, and $ZrSiO_4$.

3. A solid diffusion source as set forth by claim 1, comprising from about 50 to about 90% by weight of said compound of silicon and phosphorus, and from about 50 to about 10% by weight of said additive.

4. A solid diffusion source as set forth in claim 3, wherein said compound is $SiP_2O_7$ and said additive is selected from the group consisting of $ZrO_2$, $ZrSiO_4$, and MgO.

5. A solid phosphorus dopant source comprising from about 50 to about 90% by weight $SiP_2O_7$ and from about 50 to about 10% by weight of an additive material melting above 2,000°C selected from the group consisting of $ZrO_2$, $ZrSiO_4$, and MgO.

6. A solid phosphorus dopant source as set forth in claim 5 wherein said additive is $ZrO_2$.

7. A solid phosphorus containing body comprising about 70% by weight $SiP_2O_7$ and about 30% by weight of an additive selected from the group consisting of $ZrO_2$, $ZrSiO_4$, and MgO.

8. A body as set forth in claim 7 comprising 30% by weight $ZrO_2$.

* * * * *